United States Patent
Ha et al.

(10) Patent No.: US 7,616,630 B2
(45) Date of Patent: Nov. 10, 2009

(54) SEMICONDUCTOR MEMORY DEVICE

(75) Inventors: Sung-Joo Ha, Ichon-shi (KR); Ho-Youb Cho, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 668 days.

(21) Appl. No.: 11/024,907

(22) Filed: Dec. 30, 2004

(65) Prior Publication Data

US 2005/0276146 A1 Dec. 15, 2005

(30) Foreign Application Priority Data

Sep. 6, 2004 (KR) .................. 10-2004-0070848

(51) Int. Cl.
*H04L 12/50* (2006.01)
(52) U.S. Cl. .................. 370/386; 370/379; 370/382; 370/378; 365/51; 365/63; 365/230.03
(58) Field of Classification Search ............. 370/351, 370/280, 388; 365/63, 201, 203, 220, 230.03, 365/230.08, 233
See application file for complete search history.

(56) References Cited

U.S. PATENT DOCUMENTS

| 5,598,408 | A | * | 1/1997 | Nickolls et al. | ............. | 370/351 |
| 5,604,710 | A | * | 2/1997 | Tomishima et al. | .... | 365/230.03 |
| 5,732,040 | A | * | 3/1998 | Yabe | .................. | 365/189.18 |
| 5,812,490 | A | * | 9/1998 | Tsukude | .................. | 365/233 |
| 6,067,260 | A | * | 5/2000 | Ooishi et al. | ................. | 365/200 |
| 6,115,300 | A | * | 9/2000 | Massoumi et al. | ......... | 365/200 |
| 6,154,406 | A | * | 11/2000 | Miyano et al. | .............. | 365/220 |
| 6,301,143 | B1 | * | 10/2001 | Fujita et al. | .................. | 365/63 |
| 6,327,214 | B1 | * | 12/2001 | Yoon et al. | ............. | 365/230.03 |
| 6,490,208 | B2 | | 12/2002 | Yoon | | |
| 6,498,741 | B2 | * | 12/2002 | Matsudera et al. | ............ | 365/63 |

(Continued)

FOREIGN PATENT DOCUMENTS

JP 2004-5856 1/2004

(Continued)

*Primary Examiner*—Ayaz R Sheikh
*Assistant Examiner*—Andrew C Lee
(74) *Attorney, Agent, or Firm*—Lowe Hauptman Ham & Berner, LLP

(57) ABSTRACT

A semiconductor memory device resolves skew problem due to delay difference between the case when data that is inputted through data input/output (IO) pin is transferred to one global I/O bus and the case when transferred to another global I/O bus based on data width option. The semiconductor memory device includes a first data IO pad formed at one side of a chip, a second data IO pad formed at the other one, a first global data bus receiving data from the first data IO pad, a second global data bus receiving data from the second data IO pad, a first data path for transferring data from the first data IO pad to the first global data bus, a second data path for transferring data from the first data IO pad to the second global data bus, and a third data path for transferring data inputted to the second data IO pad to the first global data bus depending on data width option, wherein data transfer time of the second data path is substantially equal to data transfer time of the third data path.

5 Claims, 4 Drawing Sheets

U.S. PATENT DOCUMENTS

| | | | | |
|---|---|---|---|---|
| 6,512,719 B2 * | 1/2003 | Fujisawa et al. | ............. | 365/233 |
| 2002/0003736 A1 * | 1/2002 | Fujisawa et al. | ............. | 365/203 |
| 2003/0179631 A1 * | 9/2003 | Koob et al. | ................. | 365/200 |
| 2005/0015560 A1 | 1/2005 | Bae | | |

FOREIGN PATENT DOCUMENTS

| | | |
|---|---|---|
| KR | 102000042413 | 7/2000 |
| KR | 1020020058586 | 7/2002 |
| KR | 2003-0028473 | 4/2003 |

* cited by examiner

SEMICONDUCTOR MEMORY DEVICE

FIELD OF INVENTION

The present invention relates to a semiconductor design technique; and, more particularly, to a semiconductor memory device for reducing data skew due to data width option.

DESCRIPTION OF PRIOR ART

Typically, a data bus for transferring data that is inputted through a data input/output (I/O) pin to a memory cell array is called as a global I/O bus (GIO) and there is included hierarchical I/O bus architecture for data transmission between respective bit-lines and the global I/O bus (GIO) within the cell array.

On the other hand, a semiconductor memory device such as DDR SDRAM includes 16 data I/O pins (DQ) and 16 global I/O buses (GIO) to support ×4, ×8 and ×16 data width options. Accordingly, in the ×16 case, data is transferred through the data input/output pins (DQ) and their corresponding global I/O buses (GIO). On the other hand, in ×4 or ×8 case, because the data input/output pins (DQ) are not matched with the global I/O buses (GIO) one-to-one basis, multiplexing process is required for transferring data that is inputted through the data input/output pins (DQ) to the specific global I/O buses (GIO), which may be performed by a data multiplexer.

In the DRAM, time from input of an active command to input of a read or write command is called as tRCD (RAS to CAS delay).

FIG. 1 is a plane diagram of a conventional semiconductor memory device, which roughly shows the path for transferring data that is inputted through the data input pad to a memory bank.

Referring to FIG. 1, the semiconductor memory device includes memory banks BANK0, BANK1, BANK2, BANK3, global I/O buses UGIO0, UGIO1, . . . , LGIO2, LGIO3 for transferring data to the memory banks, data/input pads UDQ0, UDQ1, . . . , LDQ2, LDQ3 for receiving external data, data paths for transferring data from the data input/output pads UDQ0, UDQ1, . . . , LDQ2, LDQ3 to the global I/O buses UGIO0, UGIO1, . . . , UGIO2, UGIO3, and a global lines 50 connected between the data paths.

For reference, in the DDR semiconductor memory device, two global lines are needed per data input/output pad. Further, in the DDR II semiconductor memory device, four global lines are needed per data input/output pad and, even if operated in ×8 mode, total 32 global lines are needed.

FIG. 2 in detail shows the paths through which the semiconductor memory device transfers data that is inputted through the data input/output pads to the global I/O buses depending on the data width option.

Referring to FIG. 2, the conventional semiconductor memory device includes data input/output pads (UDQ/UDM pads, LDQ/LDM pad) 12, 14 for receiving external data, buffering units (U_buffering unit, L_buffering unit) 22, 25 for arranging and outputting inputted data in response to data strobe signals UDQS, LDQS, data multiplexers (U_data multiplexer, L_data multiplexer) 32, 34 for selecting output signals from the buffering units 22, 24 in response to data width option signals ×4, ×8, and input data sense amplifiers (U_input data sense amplifier, L_input data sense amplifier) 42, 44 for sensing and amplifying the output signals from the data multiplexers 32, 34 in response to a driving signal BAYBD to apply to global I/O buses UGIO, LGIO in response to a bus input signal DINSTBp.

On the other hand, as described above, the semiconductor memory device changes the activated data input/output pads depending on the data width option.

More particularly, in the ×16 mode, since all the data input/output pads are activated, data that are inputted through the UDQ/UDM pad 12 and the LDQ/LDM pad 14 are applied to the corresponding global I/O buses UGIO, LGIO through respective paths. However, in the ×4 or ×8 mode, since only the LDQ/LDM pad 14 is activated, data that is inputted through the LDQ/LDM pad 14 is applied one of the global I/O buses UGIO, LGIO based on the address. In other words, in the ×4 or ×8 mode, the global I/O bus that will carry the data that is inputted through the LDQ/LDM pad 14 can be the global I/O bus UGIO according to the address.

As such, in the ×4 or ×8 mode, when the data that is inputted through the LDQ/LDM pad 14 is to be transferred to the global I/O bus UGIO, output data of the L_buffering unit 24 should be transferred to the U_data multiplexer 32 through the global line 50 because the U_data multiplexer 42 connected to the global I/O bus UGIO is arranged in the side of the UDQ/UDM pad 12.

Accordingly, compared to the case where the data that is inputted through the LDQ/LDM pad 14 is to be transferred to the global I/O bus LGIO, it takes longer time to transfer to the global I/O bus UGIO. That is, data skew occurs with the delay due to the global line 50 because the data that is inputted through the LDQ/LDM pad 14 should go through the global line 50 to be transferred to the global I/O bus UGIO.

On the other hand, since the DRAM operates internally in synchronization with a clock signal, in either case where the data that is inputted through the LDQ/LDM pad 14 is to be transferred to the global I/O bus UGIO or the global I/O bus LGIO, the operation should be performed in synchronization with one clock signal.

However, as described above, because of the skew between the case where the data that is inputted through the LDQ/LDM pad 14 is transferred to the global I/O bus UGIO and the case where transferred to the global I/O bus LGIO, it becomes difficult to adjust timing so as to operate in synchronization with one clock signal. That is, margin in timing adjustment is reduced by the amount of the skew.

Further, since the period of the clock becomes shorter as the memory operates at higher speed recently, it is more difficult to ensure the timing margin.

Therefore, in use of the conventional semiconductor memory device, there is a problem due to data skew, which makes it impossible to obtain a clock frequency of the specification, resulting in chip failure.

SUMMARY OF INVENTION

It is, therefore, an object of the present invention to provide a semiconductor memory device for resolving skew problem due to delay difference between the case when data that is inputted through data input/output pin is transferred to one global I/O bus and the case when transferred to another global I/O bus based on data width option.

In accordance with an aspect of the present invention, there is provided a semiconductor memory device including a first data input/output pad formed at one side of a chip, a second data input/output pad formed at the other side of the chip, a first global data bus receiving data from the first data input/output pad, a second global data bus receiving data from the second data input/output pad, a first data path for transferring data from the first data input/output pad to the first global data bus, a second data path for transferring data from the second data input/output pad to the second global data bus, and a third data path for transferring data that is inputted to the second data input/output pad to the first global data bus depending on data width option, wherein data transfer time of the second data path is substantially equal to data transfer time of the third data path.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
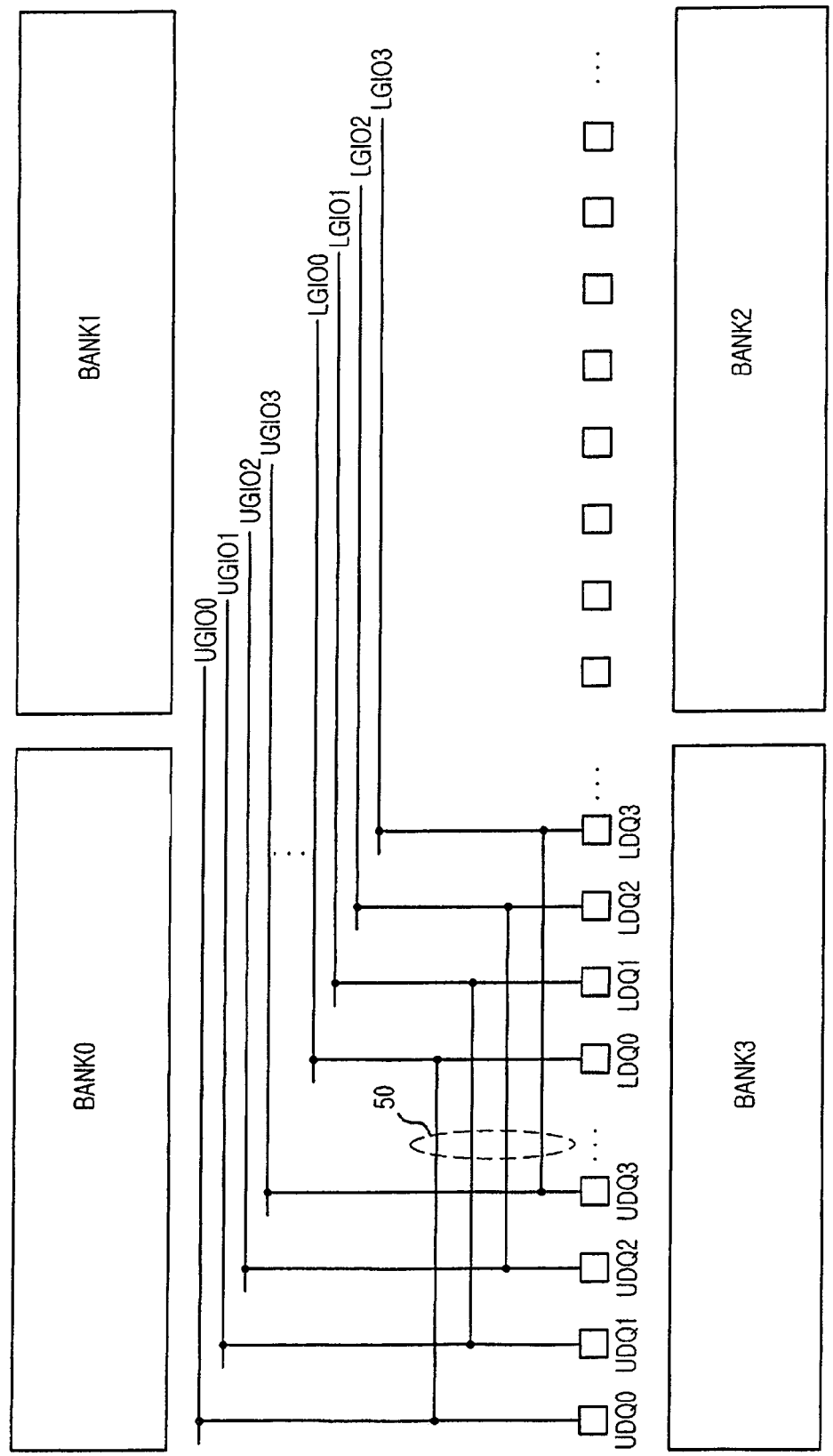
FIG. 1 is a plane diagram showing a conventional semiconductor memory device.
Figure 2:
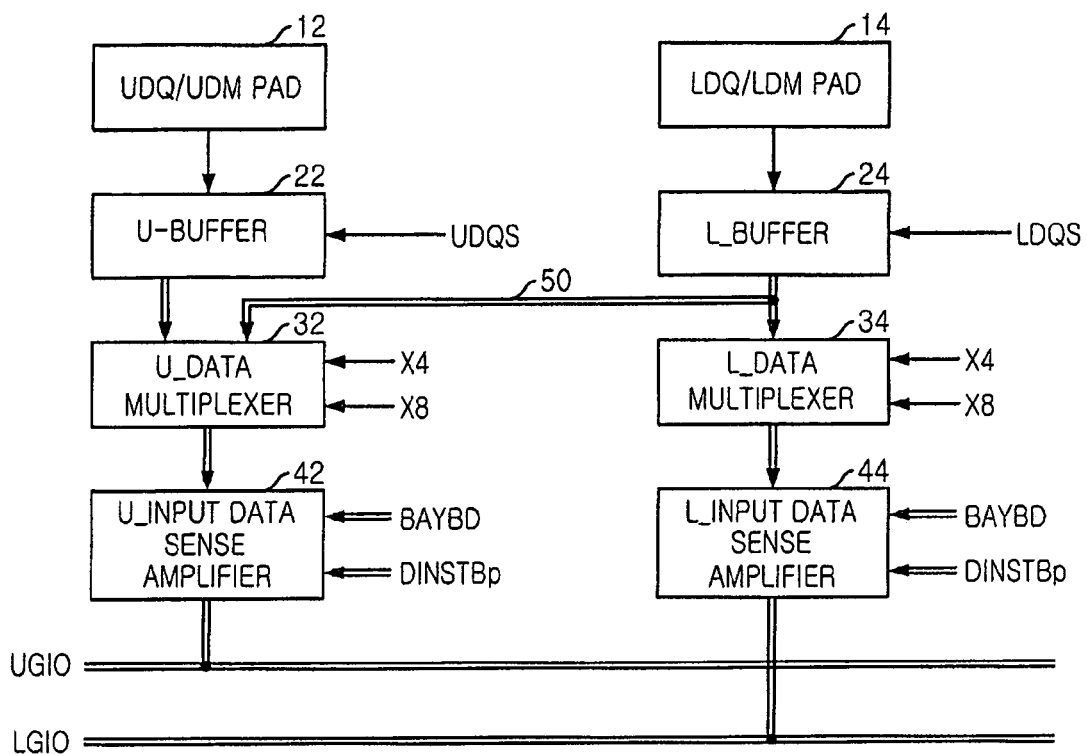
FIG. 2 is a diagram showing paths from input/output pads to global I/O buses in a conventional semiconductor memory device.
Figure 3:
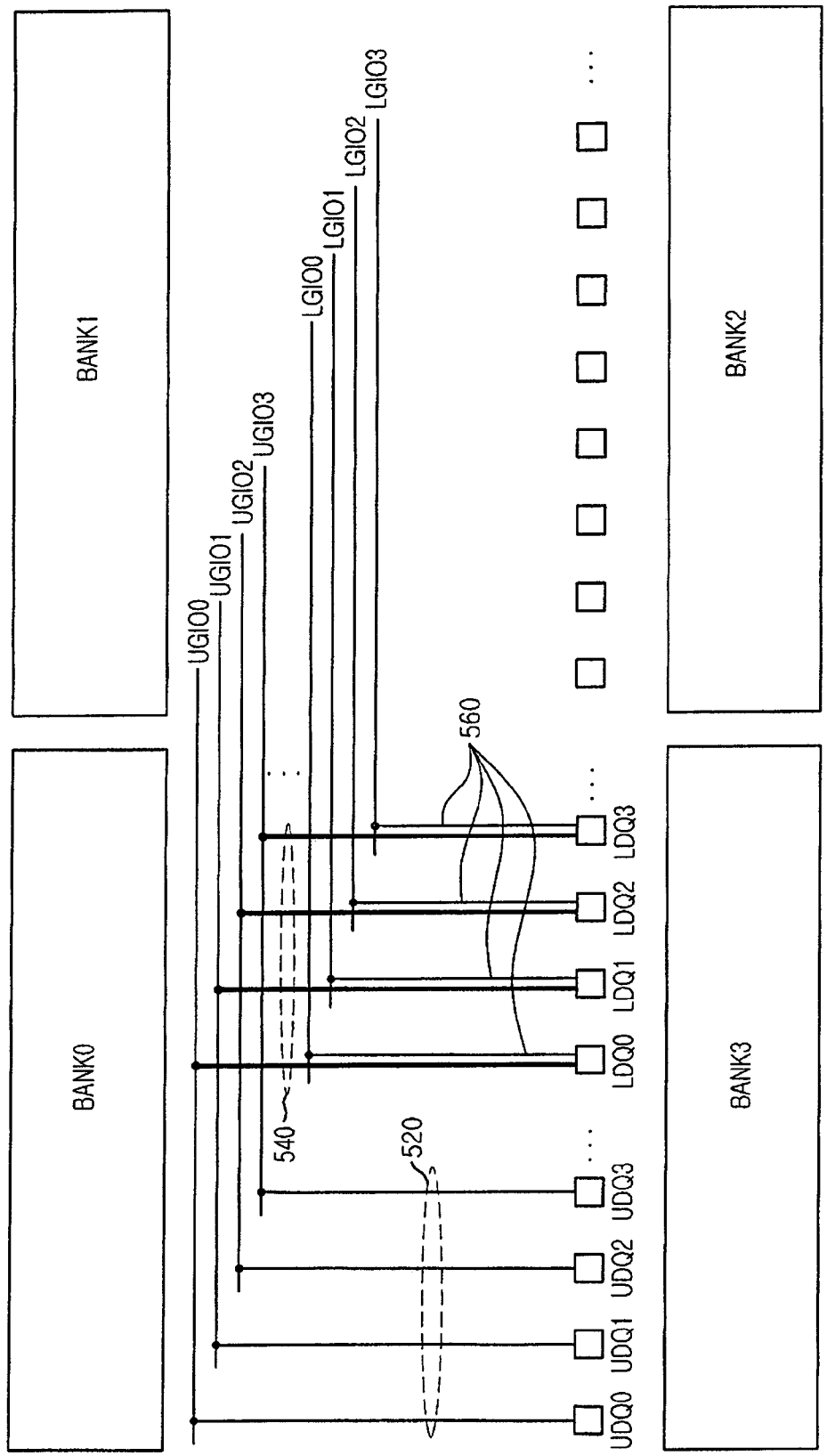
FIG. 3 is a plane diagram showing a semiconductor memory device in accordance with the present invention.

FIG. 3 is a plane diagram showing a semiconductor memory device in accordance with a preferred embodiment of the present invention.

Referring to FIG. 3, the semiconductor memory device of the present invention includes data input/output pads UDQ0-UDQ3, ..., LDQ0-LDQ3, ... formed in one side of a chip and the other side of the chip for receiving external data, global I/O buses UGIO0-UGIO3, ..., LGIO0-LGIO3, ... for transferring the data to memory banks BANK0, BANK1, BANK2, BANK3, data paths 520, 560 for transferring the data that are inputted to the data input/output pads UDQ0-UDQ3, ..., LDQ0-LDQ3, ... to the global I/O buses UGIO0-UGIO3, ..., LGIO0-LGIO3, ..., respectively, and a data path 540 for transferring the data that are inputted to the data input/output pads LDQ0-LDQ3, ... to the global I/O buses UGIO0-UGIO3, ... depending on data width option.

As described above, the semiconductor memory device of the present invention separately includes the data path 540 for transferring the data that are inputted to the data input/output pads LDQ0-LDQ3, ... to the global I/O buses UGIO0-UGIO3, ... in order to make delay time equal between the time taken to transfer the data that are inputted to the data input/output pads LDQ0-LDQ3, ... to the global I/O buses UGIO0-UGIO3, ... and the time taken to transfer to the global I/O buses LGIO0-LGIO3, ..., i.e., there is no skew. Accordingly, tDQSS that means time difference between the data strobe signal and the internal clock can be adjusted finely so as to obtain a clock frequency of the specification. Further, chip yield is improved.

Further, the semiconductor memory device of the present invention does not require the conventional global line for transferring the data that are inputted to the data input/output pads LDQ0-LDQ3, ... to the global I/O buses UGIO0-UGIO3, .... That is, a DDR semiconductor memory device can remove two global lines per data input/output pad. A DDR II semiconductor memory device can remove 4 global lines per data input/output pad, even total 32 global lines in the ×8 mode.

Figure 4:
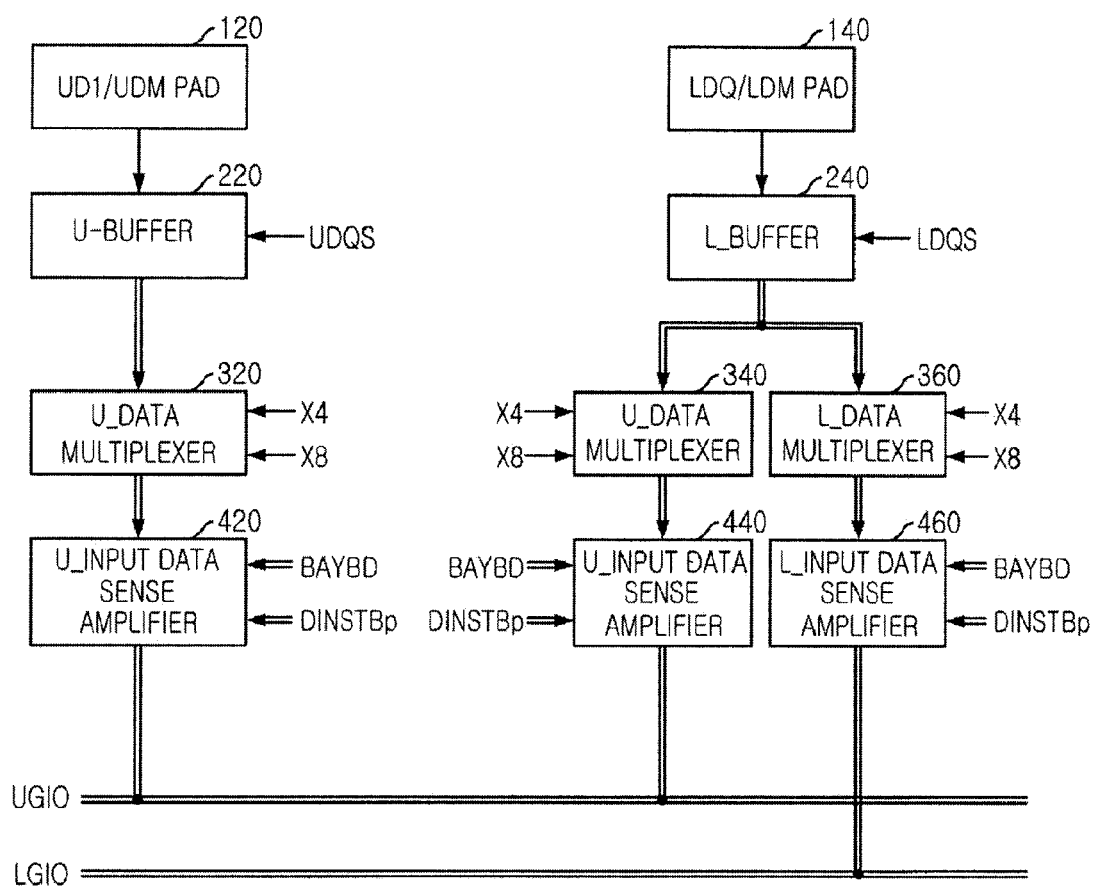
FIG. 4 is a diagram showing paths from input/output pads to global I/O buses in accordance with a preferred embodiment of the present invention.

FIG. 4 is a diagram showing paths from input/output pads to global I/O buses in accordance with a preferred embodiment of the present invention.

It will be described for the data paths 520, 540, 560 for the data that are inputted to the data input/output pads 120, 140 are transferred to the global I/O buses with reference to FIG. 4.

The data path 520 includes a U_buffering unit 220 for arranging and outputting the data that is inputted through the data input/output pad, UDQ/UDM pad, 120 in response to the data strobe signal UDQS, a data multiplexer, U_data multiplexer, 320 for selecting the output signal of the buffering unit 220 depending on data width option ×4, ×8, and an input data sense amplifier, U_input data sense amplifier, 420 for sensing and amplifying the output signal of the data multiplexer 320 in response to a driving signal BAYBD and transferring the amplified signal to the global I/O bus UGIO in response to a bus input signal BINSTBp.

The data path 540 includes a buffering unit, L_buffering unit, 240 for arranging and outputting the data that is inputted through the data input/output pad 140 in response to the data strobe signal LDQS, a data multiplexer, U_data multiplexer, 340 for selecting the output signal of the buffering unit 240 depending on data width option ×4, ×8, and an input data sense amplifier, U_input data sense amplifier, 440 for sensing and amplifying the output signal of the data multiplexer 340 in response to the driving signal BAYBD and transferring the amplified signal to the global I/O bus UGIO in response to the bus input signal BINSTBp.

The data path 560 includes the buffering unit 240 for arranging and outputting the data that is inputted through the data input/output pad 140 in response to the data strobe signal LDQS, a data multiplexer, L_data multiplexer, 360 for selecting the output signal of the buffering unit 240 depending on data width option ×4, ×8, and an input data sense amplifier, L_input data sense multiplexer, 460 for sensing and amplifying the output signal of the data multiplexer 360 in response to the driving signal BAYBD and transferring the amplified signal to the global I/O bus LGIO in response to the bus input signal BINSTBp.

The data paths for transferring the data that is inputted through the LDQ/LDM pads 140 to the global I/O buses LGIO, UGIO shares the L_buffering unit 240.

It will be briefly described for procedure for transferring the data that is inputted through the LDQ/LDM pad 140 to the global I/O bus UGIO in ×4 or ×8 mode in the prescribed semiconductor memory device.

First, the data that is inputted through the LDQ/LDM pad 140 is arranged in the L_buffering unit 240 and the U_data multiplexer 340 is selected based on data width option ×4, ×8 to transfer to the U_input data sense amplifier 440. Further, the U_input data sense amplifier 440 that is activated by the driving signal BAYBD and senses and amplifies the data to apply to the global I/O bus UGIO in response to the bus input signal DINSTBp.

For reference, in the ×16 mode, the data that is inputted through the UDQ/UDM pad 120 is transferred to the global I/O bus UGIO through the U_buffering unit 220, the U_data multiplexer 320 and the U_data sense amplifier 420, and the data that is inputted through the LDQ/LDM pad 140 is transferred to the global I/O bus LGIO through the corresponding path.

Thus, the semiconductor memory device of the present invention has, in addition to a path for transferring data that is inputted through the input/output pad to the corresponding global I/O bus, a separate path for transferring data that is inputted through the input/output pad to some other global I/O bus depending on the data width option. That is, the present invention does not require any global line for sharing the existing path in data transmission to some other global I/O bus as in the conventional semiconductor memory device so as to eliminate skew due to the global line. By removing the skew as such, clock frequency of the specification can be obtained and, accordingly, chip yield can be improved.

The present application contains subject matter related to the Korean patent application No. KR 2004-70848, filled in the Korean Patent Office on Sep. 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a first global data bus for selectively receiving an inputted data through a first data input/output pad or second data input/output pad;
   a second global data bus for receiving an inputted data through the second data input/output pad;
   a first data path for transferring data from the first data input/output pad to the first global data bus;
   a second data path for transferring data from the second data input/output pad to the second global data bus; and
   a third data path for transferring data that is inputted through the second data input/output pad to the first global data bus depending on a data width option, wherein the number of data corresponding to the data width option is accessible; and
   wherein a data transfer time of the second data path is substantially equal to a data transfer time of the third data path.

2. The semiconductor memory device as recited in claim 1, wherein the first data path includes:
   first buffering means for arranging and outputting data that is inputted from the first data input/output pad;
   a first data multiplexer for selecting the output signal of the first buffering means depending on the data width option; and
   a first input data sense amplifier for sensing and amplifying the output signal of the first data multiplexer to apply to the first global data bus in response to a driving signal.

3. The semiconductor memory device as recited in claim 2, wherein the second data path includes:
   second buffering means for arranging and outputting data that is inputted from the second data input/output pad;
   a second data multiplexer for selecting the output signal of the second buffering means depending on the data width option; and
   a second input data sense amplifier for sensing and amplifying the output signal of the second data multiplexer to apply to the second global data buses in response to the driving signal.

4. The semiconductor memory device as recited in claim 3, wherein the third data path includes:
   third buffering means for arranging and outputting data that is inputted from the second data input/output pad;
   a third data multiplexer for selecting the output signal of the third buffering means depending on the data width option; and
   a third input data sense amplifier for sensing and amplifying the output signal of the third data multiplexer to apply to the first global data buses in response to the driving signal.

5. The semiconductor memory device as recited in claim 4, wherein the second and third buffering means are a shared buffering means.

* * * * *